Figure 2:
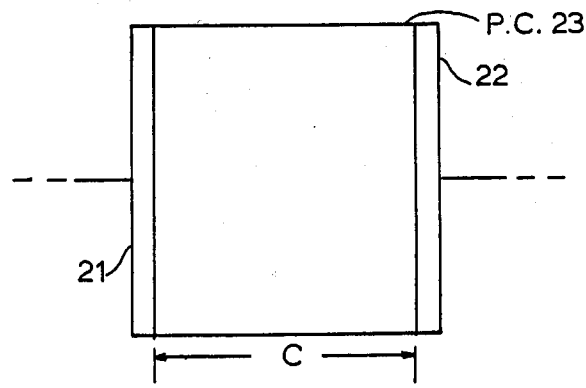

United States Patent [19]

Barrett

[11] Patent Number: 4,689,246

[45] Date of Patent: Aug. 25, 1987

[54] METHOD OF FABRICATING A PBS-PBSE IR DETECTOR ARRAY

[75] Inventor: John R. Barrett, Wayland, Mass.

[73] Assignee: Itek Corporation, Lexington, Mass.

[21] Appl. No.: 838,766

[22] Filed: Mar. 12, 1986

Related U.S. Application Data

[62] Division of Ser. No. 665,271, Oct. 26, 1984, Pat. No. 4,602,158.

[51] Int. Cl.$^4$ ............................................. B05D 5/12
[52] U.S. Cl. .................................... 427/76; 437/228
[58] Field of Search ..................... 427/87, 83, 76, 92

[56] References Cited

U.S. PATENT DOCUMENTS

| | | | |
|---|---|---|---|
| 2,809,132 | 10/1957 | Bloem | 427/87 |
| 2,997,409 | 8/1961 | McLean | 427/76 |
| 3,121,023 | 2/1964 | Spencer | 427/76 |
| 3,178,312 | 4/1965 | Johnson | 427/76 |
| 4,427,713 | 1/1984 | White | 427/54.1 |
| 4,602,158 | 7/1986 | Barrett | 250/338 SE |
| 4,617,608 | 10/1986 | Blonder | 73/705 |

Primary Examiner—John D. Smith
Assistant Examiner—Vi D. Dang
Attorney, Agent, or Firm—Michael H. Wallach; Robert F. Rotella

[57] ABSTRACT

A silicon wafer is provided which does not employ individually bonded leads between the IR sensitive elements and the input stages of multiplexers. The wafer is first coated with lead selenide in a first detector array area and is thereafter coated with lead sulfide within a second detector array area. The described steps result in the direct chemical deposition of lead selenide and lead sulfide upon the silicon wafer to eliminate individual wire bonding, bumping, flip chiping, planar interconnecting methods of connecting detector array elements to silicon chip circuitry, e.g., multiplexers, to enable easy fabrication of very long arrays. The electrode structure employed, produces an increase in the electrical field gradient between the electrodes for a given volume of detector material, relative to conventional electrode configurations.

3 Claims, 2 Drawing Figures

METHOD OF FABRICATING A PBS-PBSE IR DETECTOR ARRAY

The invention described herein was made in the performance of work under NASA Contract No. NAS-27999, Subcontract No. 3581, and is subject to the provisions of Section 305 of the National Aeronautics and Space Act of 1958 (72 Stat. 435; 42 U.S.C. 2457).

This is a divisional of co-pending application Ser. No. 665,271 filed on Oct. 26, 1984 now U.S. Pat. No. 4,602,158.

BACKGROUND OF THE INVENTION

The present invention relates to the field of converting optical images to electrical pulse trains.

It is deemed desirable to fabricate very long high density linear arrays of PbS and PbSe infrared sensitive photoconductor material for scanning optical images and converting them into electrical signals representative of the images. The prior art suggests the use of arrays of PbS and arrays of PbSe for detecting infrared radiation. See SPIE. Volume 197, pp. 9–18 (1979).

While U.S. Pat. No. 3,808,435 teaches the use of arrays of photosensitive material, detecting infrared radiation, this material is electrically coupled to a CCD semiconductor chip through numerous separate electrical leads. See FIG. 3 and column 2, lines 1 through 10. The CCD devices are employed to serially generate electrical signals proportional to the intensity of infrared radiation projected upon the light sensitive elements connected in parallel to the CCD stages. The image to be converted into electrical pulse trains is scanned across the array of detectors so that portions of the image are progressively sensed by successive detectors in respective columns of the array. The result is the shifting, along the length of the CCD, of injected charges in synchronism with the scanning of the image. In U.S. Pat. No. 3,883,437, each IR detector is coupled to a particular CCD stage via electrical leads which pass through a set of openings in the insulating oxide layer. See the bottom of column 2 and column 5 lines 53 through 55. In U.S. Pat. No. 4,064,533, PbS elements are electrically connected to a silicon CCD device via conductors 24 shown in FIG. 1; see the top of column 6.

Thus the prior art teaches the use of discrete elements of IR sensitive material electrically coupled via leads or other metallic electrodes to multiplexing circuitry in a silicon wafer, such as a CCD. The necessity of providing a separate lead or contact from each detector, to run off of the focal plane where the IR detectors are positioned, to an associated stage of a multiplexing unit, for converting the parallel signals into a serial pulse train, makes it impractical to fabricate arrays greater than 50 to 100 elements long, due to the bonding of numerous leads between the photosensors and the multiplexer units.

SUMMARY AND OBJECTS OF THE INVENTION

Thus it is an important object of this invention to provide a method of fabricating a silicon wafer containing multiplexing circuitry, having very large numbers of IR sensitive elements thereon, which elements need not be individually bonded to associated stages of the multiplexers.

It is a further object of the present invention to provide a method of directly coating surfaces of a silicon wafer with both lead sulfide and lead selenide IR detector material, to provide a composite IR detector focal plane member having an extended range of spectral response.

It is a further object of the present invention to eliminate electrical connections by directly chemically depositing lead sulfide and/or lead selenide upon the surface of pre-metallized silicon wafers, preferably containing multiplexer devices.

It is yet a further object of the present invention to provide a light detector having an electrode structure which increases the electrical field potential gradient across a given quantity of photosensitive material relative to conventional electrode placement, to increase the gain and sensitivity of the photosensitive elements.

It is also an object of the invention to provide a method for fabricating the array which eliminates the prior art steps of etching away of photosensitive material to produce numerous "islands" of detector elements which, if the etching is not highly precise, could result in malfunctioning of the array.

In accordance with a preferred method of the present invention, a silicon wafer is provided having a first group of electrodes thereon coupled to a multiplex unit therein, defining a first IR detector array area, and a second group of electrodes thereon defining a second IR detector array area. The wafer is immersed in a bath having a lead to selenium ion ratio of 5:1. The deposition of PbSe is carried out for 60 minutes with an ever increasing temperature of the bath from 25° C. to 50° C., and a second coat of PbSe is thereafter added in the same manner through the use of the same bath with however an iodine solution added to produce a lead to iodide ion ratio of 100:1. The resulting PbSe layer is thereafter sensitized by baking the wafer in air at a temperature of 375° C. for a period of 90 minutes. The PbSe deposited is thereafter etched away, to leave a remaining unitary strip (rather than islands) of PbSe overlaying the first array area. The wafer is thereafter immersed in a bath having a $Pb^{++}$:$S^{--}$:$OH^{-}$ ion ratio of 1:4:10, the deposition time being 75 minutes, and the temperature increasing between 12° C. and 75° C. during the immersion process. This produces a first lead sulfide coat which is dried. Generally, additional coats may be added to tailor the detector characteristics for a given application, such as resistivity, noise, responsivity, time constant and spectral response. The resulting PbS layer is thereafter etched away to leave a second unitary strip (rather than islands) of PbS material overlaying the second array area. A tooth-like configuration of the electrodes result in an increase in the electrical field gradient across the IR sensitive elements relative to conventional electrode placement.

Figure 1:
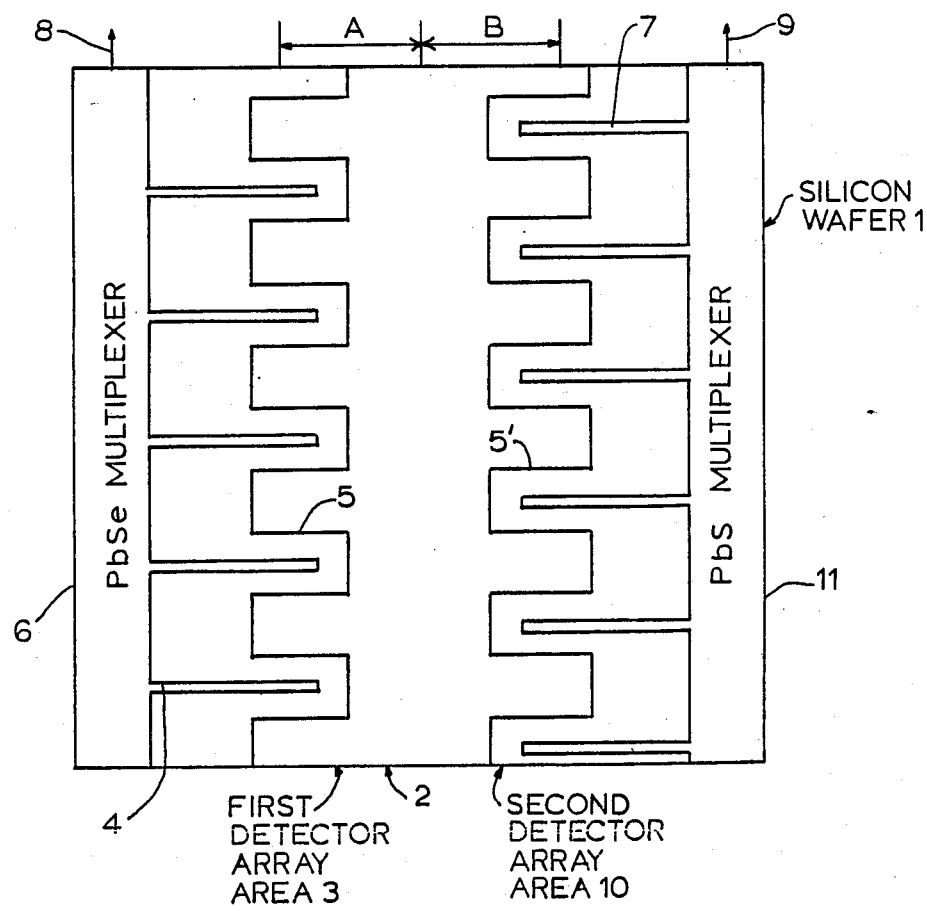

Other objects, features and advantages of the present invention will become apparent upon the study of the following specific description taken in conjunction with the drawing in which:

FIG. 1 illustrates the silicon wafer with the above mentioned linear arrays of IR detectors thereon; and FIG. 2 illustrates a point with respect to the advantages of the tooth-like electrodes.

SPECIFIC DESCRIPTION

Referring now to FIG. 1, a preferred configuration of the invention comprises a silicon wafer 1 having a premetallized centralized electrode 2 positioned upon the wafer. A first linear detector array area 3, comprises a first set of rectangular tooth-like projections 5 of the central electrode 2 and premetallized thin elongated electrodes 4, the electrodes 4 being coupled to associated stages of PbSe multiplexer 6, which preferably is formed within silicon wafer 1. In the final product, PbSe will be present between thin, elongated electrodes 4, and the tooth-like projections 5 of electrode 2, to form a first linear array area. In a similar manner, a second linear detector array area 10 includes a second set of rectangular tooth-like projections 5' of the central electrode 2, together with thin, elongated electrodes 7 as shown. PbS will be positioned between the thin, elongated electrodes 7 and the tooth-like projections 5', and as a result two linear arrays will be closely positioned to provide an enhanced wavelength IR sensitive detector unit. More specifically, a strip of PbSe having a width of dimension "A" will be formed (area 3) together with a strip of PbS (area 10) having a width of dimension "B". This will result in the detector elements being square.

Multiplexer 6, whether a CCD or otherwise, will convert the signals generated by the PbSe material into pulse trains which are serially generated upon output lead 8 of the "PbSe" multiplexer 6. In like manner, "PbS" multiplexer 11 having its stages coupled to elongated leads 7, will generate a serial pulse train at the output of lead 9.

The deposition of PbSe in the first detector array area is accomplished by mixing selenourea (0.2 molar), with lead (II) acetate (1.1 molar), in quantities to produce a first bath having a lead to selenium ion ratio of 5:1. The silicon wafer is immersed in the resulting first bath for a period of 60 minutes, with an ever increasing temperature of the bath from the initial 25° C. level upon immersion, to 50° C. at the end of the 60 minute period; a conventional bath heater could be employed for this purpose. The wafer is preferably rotated in the solution at 2 revolutions per minute.

A second bath is provided, like the first bath, but having an iodine solution applied to the first bath to provide a preferred Pb:I ion ratio of 100:1. After insertion of the wafer into the second bath, the temperature is increased during the 60 minute immersion period as specified above. It is believed that satisfactory results are also attainable if the lead to selenium ion ratio is within the range of 4:1 to 7:1, the immersion time period is varied between 40 and 90 minutes; the initial bath temperature upon the wafer being between 20° C. and 30° C. and the final bath temperature being between 45° C. and 55° C. The Pb:I ion ratio could be between 80:1 and 130:1. Other halogen ions such as, for example, $I_3$ or $Br^-$ may be used.

The resulting PbSe film formed upon the silicon wafer is now sensitized by baking the wafer in air at a temperature of 375° C. for a period of 90 minutes. It is believed that satisfactory results would be attainable employing a temperature range of 360° C. to 395° C. for periods ranging between 80 minutes and 120 minutes.

The next step involves removing the PbSe from the surface areas of the silicon wafer 1, except for the first detector array area 3. This conventional removable process involves the application of positive photoresist, such as AZ1450J; photoresist softbake; alignment of the appropriate array mask over the silicon wafer; and exposure, using a mask aligner, with an appropriate ultraviolet light source; development of the resist pattern over the first detector array area 3 to protect it from being etched away, and chemically etching away the unwanted PbSe in the areas outside of the first detector array area 3. Temporary or permanent protection of the delineated PbSe strip occupying the first detector array area 3 is thereafter provided by employing a negative photoresist and using a process similar to the previous steps.

PbS is now chemically deposited over the entire surface portion of silicon wafer 1, by providing a third bath having a lead to sulfide to hydroxide ion ratio of 1:4:10. This ratio is attainable by mixing thiourea (0.02M), lead (II) acetate (0.08M), and sodium hydroxide (0.2M), thereby to form the third bath. The silicon wafer 1 is thereafter immersed into the bath for a period of 75 minutes with an initial temperature of 12° C. upon immersion and a final temperature of 75° C. upon removal. As in the case of the first and second baths, the rate of change of the third bath temperature will decrease with time, since the deposition baths are within a container in turn positioned within a heated bath maintained at the final temperature of the deposition baths throughout the entire time periods. Satisfactory results would be attainable should the 75 minute period be varied between 60 minutes and 90 minutes. The initial temperature range of the third bath could be between 10° C. and 14° C. and the final bath temperature could be between 70° C. and 80° C. The PbS coating is thereafter dried and subsequent coats may be added, if desired, as mentioned before.

The unwanted PbS deposited upon wafer 1 in areas other than within second detector array area 10, is now removed by the application of the conventional steps explained above in connection with removal of PbSe from areas outside of the first detector area 3. Long term protection of the PbSe and PbS materials involves the deposition of ZnSe over the materials by sputtering or thermal evaporation, in accordance with prior art techniques.

The resulting dual array, extended spectral response IR detector wafer, comprises a first set of aligned rectangular tooth-like electrodes 5 positioned along the left hand portion of the common conductor 2, and a second set of aligned tooth-like electrodes coupled to the right hand portion of the central conductor 2, which are staggered as shown, with respect to the first set. The third set of thin elongated electrodes 4 are coupled in parallel to the PbSe multiplexer 6, whereas thin elongated electrodes 7 are coupled in parallel to individual stages of the PbS multiplexer 11.

While the invention does not require this configuration of electrodes, the configuration shown is preferred, since the positioning of the elongated electrodes between the common tooth-like electrodes, as shown, results in an increase in the electrical field gradient across the photosensitive material therebetween, relative to the gradient produced by the straightforward placement of electrodes indicated in FIG. 2. This is because the interleaved electrode arrangement of FIG. 1 reduces the separation between the elongated electrodes and the tooth-like electrodes common to conductor 2. FIG. 2 illustrates the conventional electrode placement wherein a greater separation beteween electrodes 21 and 22, positioned on either side of a photodetector element 23, is needed for a given equivalent area of detector material. This greater separation reduces the electrical field gradient relative to the increased gradient attained by the invention, whereby the photodetector material substantially surrounds the thin elongated electrodes 4 and 7. This is evident by comparing dimension c of FIG. 2 with the distance between the electrodes of FIG. 1.

The electrode configuration and associated method described herein, also eliminates etching away of numerous portions of a deposited photodetector material to produce individual elements or islands of material, as the material is delineated as unitary strips or blocks. In contrast, producing numerous islands could result in malfunctions, if the etching process forming the islands become non-uniform. The forming of unitary strips of IR sensitive material alleviates this potential problem.

In order to minimize noise, the pre-metallized electrodes are preferably gold, adhered to the silicon wafer surface by an intermediate layer of chromium, palladium or titanium-tungsten.

While preferred embodiments of the invention have been described, it is to be understood that the invention may be practised other than as set forth above, and thus the scope of the invention is to be limited only by the language of the following claims, and reasonable equivalents thereof. For example, PbSe could be deposited in accordance with the invention without the addition of a PbS layer. The novel electrode configuration could be employed in connection with other photosensitive materials.

I claim:

1. Method of making a PbS-PbSe IR detector array comprising the steps of:
   a. providing a silicon wafer having a first group of electrodes thereon defining a first IR detector array area and a second group of electrodes thereon defining a second IR detector array area;
   b. chemically depositing a layer of PbSe over said first and second array areas by:
   b.1 preparing a first bath having a lead to selenium ion ratio of about 5:1;
   b.2 immersing said silicon wafer in said first bath for a period of about 60 minutes, the initial temperature of said bath upon immersion being about 25° C., the final temperature at the termination of said period being about 50° C;
   b.3 providing a second bath having the lead to selenium ion ratio of said first bath and additionally including an iodide ion having a lead to iodide ion ratio of about 100:1, and repeating step b.2 to deposit an additional coat of PbSe on said silicon wafer;
   c. sensitizing said PbSe layer deposited upon said silicon wafer by heating said wafer in air at a temperature of about 375° C. for a period of about 90 minutes;
   d. removing the deposited PbSe from major areas of said wafer except from said first detector array area;
   e. thereafter chemically depositing at least one layer of PbS upon said silicon wafer by providing a third bath having a lead, sulfide, and hydroxide ion therein, the ratio of lead to sulfide ion being between 1:1.25 and 1:6, and the ratio of lead to hydroxide ion being between 1:7 and 1:12;
   f. inserting said silicon wafer into said third bath for a period of between 60 minutes and 90 minutes while elevating the temperature of said bath between an initial temperature of between 10° C. and 14° C. upon immersion of said wafer therein and a final temperature of between 70° C. and 80° C. upon removal of said wafer; and
   g. removing the resulting PbS layer from major areas of said silicon wafer except for said second detector array area.

2. The method of claim 1 wherein said lead to sulfide to hydroxide ratio is about 1:4:10.

3. Method of making a PbS-PbSe IR detector array comprising the steps of:
   a. providing a silicon wafer having a first group of electrodes thereon defining a first IR detector array area and a second group of electrodes thereon defining a second IR detector array area;
   b. chemically depositing a layer of PbSe over said first and second array areas by:
   b.1 preparing a first bath having a lead to selenium ion ratio of about 5:1;
   b.2 immersing said silicon wafer in said first bath for a period of about 60 minutes, the initial temperature of said bath upon immersion being about 25° C., the final temperature at the termination of said period being about 50° C.;
   b.3 providing a second bath having the lead to selenium ion ratio of said first bath and additionally including an iodide ion having a lead to iodide ion ratio of about 100:1, and repeating step b.2 to deposit an additional coat of PbSe on said silicon wafer;
   c. sensitizing said PbSe layer deposited upon said silicon wafer by heating said wafer in air at a temperature of about 375° C. for a period of about 90 minutes;
   d. removing the deposited PbSe from major areas of said wafer except from said first detector array area;
   e. thereafter chemically depositing a layer of PbS upon said silicon wafer by providing a third bath having a lead, sulfide, and hydroxide ion therein, the ratio of lead to sulfide to hydroxide being about 1:4:10;
   f. inserting said silicon wafer into said third bath for a period of about 75 minutes while elevating the temperature of said bath between an initial temperature of between 12° C. upon immersion of said wafer therein and a final temperature of about 75° C. upon removal of said wafer; and
   g. removing the resulting PbS layer from major areas of said silicon wafer except for said second detector array area.

* * * * *